United States Patent
Lai et al.

(10) Patent No.: US 8,792,219 B2
(45) Date of Patent: Jul. 29, 2014

(54) ESD-ROBUST I/O DRIVER CIRCUITS

(75) Inventors: Da-Wei Lai, Singapore (SG);
Ying-Chang Lin, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 93 days.

(21) Appl. No.: 13/482,423

(22) Filed: May 29, 2012

(65) Prior Publication Data
US 2013/0321962 A1 Dec. 5, 2013

(51) Int. Cl.
*H02H 3/22* (2006.01)

(52) U.S. Cl.
USPC ............................................ 361/56; 361/311

(58) Field of Classification Search
USPC .................................................... 361/56, 111
See application file for complete search history.

(56) References Cited

U.S. PATENT DOCUMENTS

| | | | |
|---|---|---|---|
| 6,529,359 B1 | 3/2003 | Verhaege et al. | |
| 2004/0105201 A1 | 6/2004 | Wu et al. | |
| 2010/0315748 A1* | 12/2010 | Kwong et al. | 361/56 |

* cited by examiner

*Primary Examiner* — Danny Nguyen
(74) *Attorney, Agent, or Firm* — Ditthavong & Steiner, P.C.

(57) ABSTRACT

An ESD-robust I/O driver circuit is disclosed. Embodiments include providing a first NMOS transistor having a first source, a first drain, and a first gate; coupling the first source is coupled to a ground rail, and the first drain to an I/O pad; providing a gate driver control circuit including a second NMOS transistor having a second source, a second drain, and a second gate; and coupling the second drain to the first gate, the second source to the ground rail, wherein the gate driver control circuit provides a ground potential to the first gate during an ESD event occurring from the I/O pad to the ground rail.

20 Claims, 4 Drawing Sheets

ESD-ROBUST I/O DRIVER CIRCUITS

TECHNICAL FIELD

The present disclosure relates to electrostatic discharge (ESD) robust input/output (I/O) driver circuits. The present disclosure is particularly applicable to I/O driver circuits in 65 nanometer (nm) technology nodes and beyond.

BACKGROUND

FIG. 1 schematically illustrates a traditional general purpose I/O (GPIO) driver circuit. As shown, the circuit in FIG. 1 includes PMOS transistor 101 and NMOS transistor 103 coupled at their drains, which are further coupled to I/O pad 105 and ESD device 107. The source of PMOS transistor 101 is connected to power rail 109 (e.g., VDD) and the source of NMOS transistor 103 is connected to ground rail 111 (e.g., VSS). Under ESD zapping from PAD to VSS, ESD current may, for instance, travel through paths 113a (e.g., from I/O pad 105 to ground rail 111 through ESD device 107) and 113b (e.g., from I/O pad 105 to ground rail 111 through power clamp 115). Paths 113a and 113b are desired ESD bypass paths that are designed as bypass paths for ESD current. However, because control logic circuit 117 may leave the gate of NMOS transistor 103 coupled to a high state (e.g., gate node 119 may be floating) during an ESD event, the ESD current may also travel through undesired path 113c (e.g., from I/O pad 105 to ground rail 111 through NMOS transistor 103). Since NMOS transistor 103 is typically fully-silicided and much smaller in size than ESD device 107, NMOS transistor 103 will burn out much quicker from the ESD current. Thus, the ESD performance of GPIO drivers may be poor despite robust ESD protection devices included in the circuit (e.g., due to the drastic impact ESD current may have on driver transistors).

FIG. 2 schematically illustrates one solution to the floating gate issue in the circuit of FIG. 1 (e.g., gate node 119 being left floating). Like the circuit in FIG. 1, the circuit in FIG. 2 is a GPIO driver circuit that includes PMOS transistor 201 and NMOS transistor 203 coupled at their drains, which are further coupled to I/O pad 205 and ESD device 207. Moreover, power rail 209 is connected to the source of PMOS transistor 201 and ground rail 211 is connected to the source of NMOS transistor 203. The circuit in FIG. 2 also includes desired, designed paths 213a (e.g., from I/O pad 205 to ground rail 211 through ESD device 207) and 213b (e.g., from I/O pad 205 to ground rail 211 through power clamp 215) for ESD current during an ESD event. However, as shown, the ESD current will also flow through parasitic diode 217 (e.g., through path 213c) to activate level shift 219 that will, in turn, feed a ground potential to gate node 221 at the gate of NMOS transistor 203, turning off NMOS transistor 203 during the ESD event. Consequently, ESD current is prevented from flowing through and burning out NMOS transistor 203.

Nonetheless, typical level shifts (e.g., level shift 219) include complex control circuits for controlling the gate of driver transistors during an ESD event. Because these complex control circuits utilize a substantial portion of I/O area for each I/O cell (e.g., due to numerous additional transistors located in each I/O cell), I/O driver circuits with typical level shifts generally lack extra area for other important components (e.g., additional resistor/capacitor elements). In addition, typical level shifts may suffer "false triggering" during normal operation (e.g., due to the complexity of typical level shifts), negatively affecting the performance of the driver transistors during normal operation.

A need therefore exists for an ESD-robust I/O driver circuit with a more efficient and effective implementation for controlling the gates of driver transistors, and enabling methodology.

SUMMARY

An aspect of the present disclosure is an ESD-robust I/O driver circuit.

Another aspect of the present disclosure is a method for implementing an ESD-robust I/O driver circuit.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: a first NMOS transistor having a first source, a first drain, and a first gate, wherein the first source is coupled to a ground rail, and the first drain is coupled to an I/O pad; and a gate driver control circuit including a second NMOS transistor having a second source, a second drain, and a second gate, wherein the second drain is coupled to the first gate, the second source is coupled to the ground rail, and the gate driver control circuit provides a ground potential to the first gate during an ESD event occurring from the I/O pad to the ground rail.

Aspects include a circuit having an ESD clamp that controls a switch to turn on the second NMOS transistor during the ESD event, and to turn off the second NMOS transistor during normal operation. Some aspects include a circuit having the ESD clamp coupled to the second gate, wherein the ESD clamp provides a turn-on signal to the second gate during the ESD event. Additional aspects include a circuit having the ESD clamp include: a third NMOS transistor having a third source, a third drain, and a third gate; and an inverter having an output terminal coupled to the second and third gates, wherein the output terminal provides a turn-on signal to the second and third gates during the ESD event. In certain aspects, the output terminal provides a turn-off signal to the second and third gates during normal operation. In various aspects, ESD current flows from the I/O pad to the ground rail through the third NMOS transistor during the ESD event.

Further aspects include a circuit having a PMOS transistor including a fourth source, a fourth drain, and a fourth gate, wherein the fourth drain is coupled to the first drain, and the fourth source is coupled to the third drain. Certain aspects include a circuit having an ESD device coupled to the I/O pad and the first drain, wherein ESD current flows from the I/O pad to the ground rail through the ESD device during the ESD event. Other aspects including a circuit having the ESD device include a fourth NMOS transistor having a fifth source, a fifth drain, and a fifth gate, wherein the fifth source and the fifth gate is coupled to the ground rail, and the fifth drain is coupled to the I/O pad.

An additional aspect of the present disclosure is a method including: providing a first NMOS transistor having a first source, a first drain, and a first gate; coupling the first source to a ground rail, and the first drain to an I/O pad; providing a gate driver control circuit including a second NMOS transistor having a second source, a second drain, and a second gate; and coupling the second drain to the first gate, the second source to the ground rail, wherein the gate driver control circuit provides a ground potential to the first gate during an ESD event occurring from the I/O pad to the ground rail.

Another aspect includes providing an ESD clamp that controls a switch to turn on the second NMOS transistor during the ESD event, and to turn off the second NMOS transistor during normal operation. Additional aspects include coupling the ESD clamp to the second gate, wherein the ESD clamp provides a turn-on signal to the second gate during the ESD event. Various aspects include: providing the ESD clamp with a third NMOS transistor having a third source, a third drain, and a third gate, and an inverter having an output terminal; and coupling the output terminal to the second and third gates, wherein the output terminal provides a turn-on signal to the second and third gates during the ESD event. In some aspects, the output terminal provides a turn-off signal to the second and third gates during normal operation. In other aspects, ESD current flows from the I/O pad to the ground rail through the third NMOS transistor during the ESD event.

Further aspects include: providing a PMOS transistor having a fourth source, a fourth drain, and a fourth gate; and coupling the fourth drain to the first drain, and the fourth source to the third drain. Certain aspects include: providing an ESD device; and coupling the ESD device to the I/O pad and the first drain, wherein ESD current flows from the I/O pad to the ground rail through the ESD device during the ESD event. Various aspects include: providing the ESD device with a fourth NMOS transistor having a fifth source, a fifth drain, and a fifth gate; and coupling the fifth source and the fifth gate to the ground rail, and the fifth drain to the I/O pad.

Another aspect of the present disclosure is a ring I/O circuit having a plurality of I/O cells, each of the I/O cells comprising: an I/O pad; a first NMOS transistor having a first source, a first drain, and a first gate, wherein the first source is coupled to a ground rail, and the first drain is coupled to the I/O pad; and a gate driver control circuit including a second NMOS transistor having a second source, a second drain, and a second gate, wherein the second drain is coupled to the first gate, the second source is coupled to the ground rail, and the gate driver control circuit provides a ground potential to the first gate during an ESD event occurring from the I/O pad to the ground rail. Further aspects include the ring I/O circuit having an ESD clamp including: a third NMOS transistor having a third source, a third drain, and a third gate; and an inverter having an output terminal coupled to at least some of the second and third gates, wherein the output terminal provides a turn-on signal to the coupled second and third gates during the ESD event, and a turn-off signal to the coupled second and third gates during normal operation.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of ESD zapping, for instance, from an I/O pad to a ground rail in an I/O driver circuit while efficiently utilizing I/O area. The present disclosure addresses and solves such problems, for instance, by, inter alia, providing a ground potential, via a gate driver control circuit, to the gate of a driver transistor coupled to an I/O pad when an ESD event occurs at the I/O pad, thereby turning off the driver transistor during the ESD event to prevent ESD current from breaking down the driver transistor.

Figure 1:
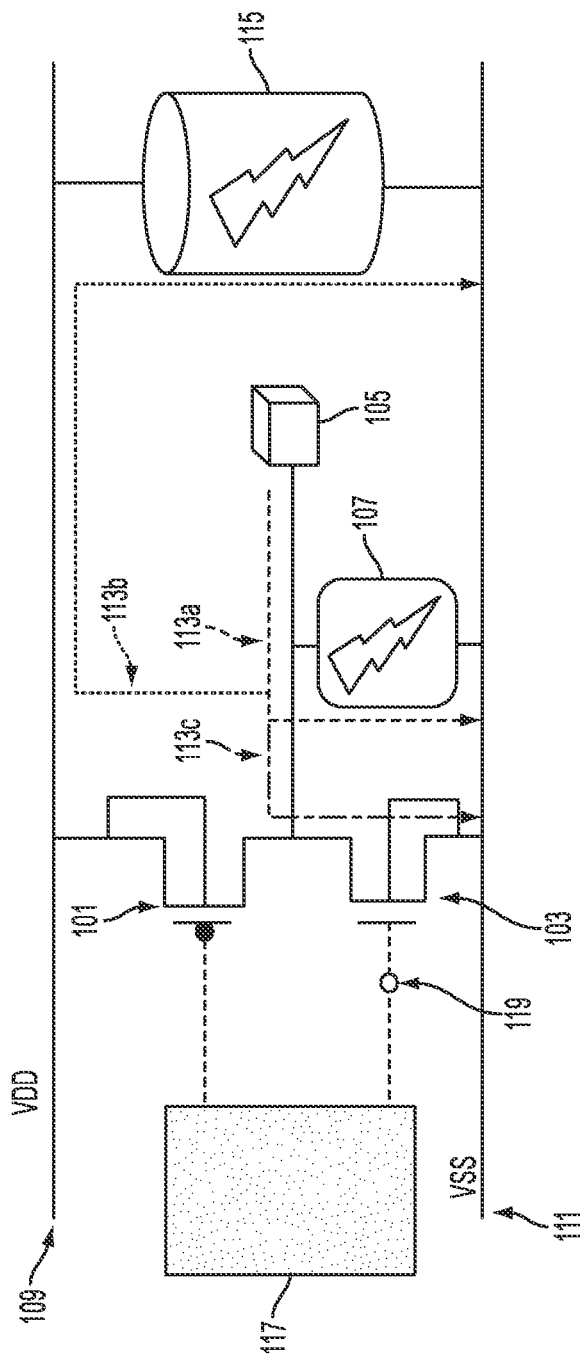
FIG. 1 schematically illustrates a traditional GPIO driver circuit.
Figure 2:
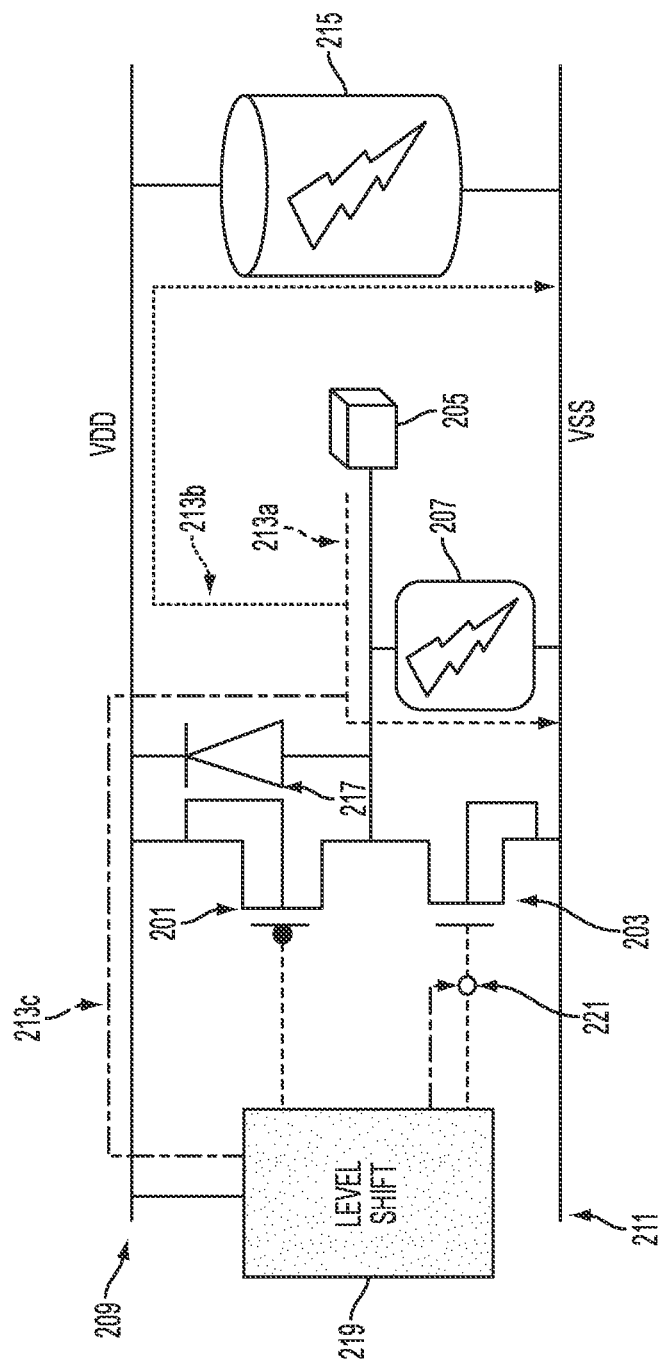
FIG. 2 schematically illustrates one solution to the floating gate issue in the circuit of FIG. 1.
Figure 3:
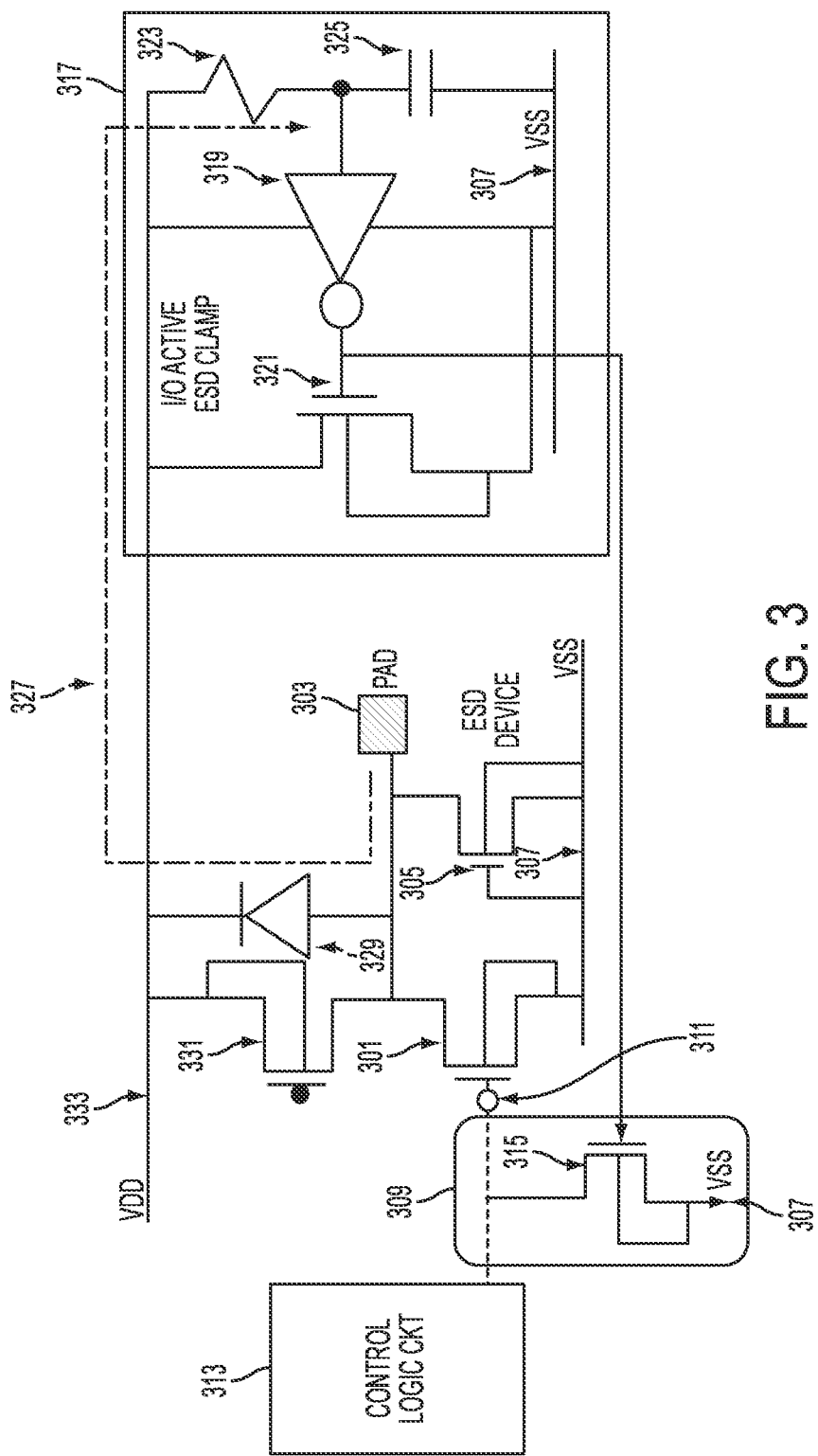
FIG. 3 schematically illustrates an ESD-robust I/O driver circuit, in accordance with an exemplary embodiment of the present disclosure.

FIG. 3 schematically illustrates an ESD-robust I/O driver circuit, in accordance with an exemplary embodiment of the present disclosure. For example, the circuit in FIG. 3 includes transistor 301 (e.g., NMOS driver transistor) having a drain coupled to I/O pad 303 and ESD device 305, a source coupled to ground rail 307, and a gate coupled to a gate driver control circuit 309. When an ESD event occurs at I/O pad 303 (e.g., ESD zapping from I/O pad 303 to ground rail 307), gate driver control circuit 309 will feed a ground potential to gate node 311, which prevents ESD current from flowing through and breaking down transistor 301 (e.g., transistor 301 is turned off despite any potential output of control logic circuit 313). As shown, gate driver control circuit 309 includes a single transistor 315 (e.g., a single NMOS transistor) for controlling the gate of transistor 301. As such, in this scenario, only one extra control transistor is added to each I/O cell that includes gate driver control circuit 309.

Moreover, the circuit in FIG. 3 includes ESD clamp 317 (e.g., I/O active ESD power clamp) having inverter 319, transistor 321 (e.g., NMOS transistor), resistor 323, and capacitor 325. Under normal operation, the output terminal of inverter 319 provides a turn-off signal to the gates of transistors 315 and 321 (e.g., the potential at the input terminal of inverter 319 is high while the potential at the output terminal is low). Consequently, during normal operation, there is no functional impact of gate driver control circuit 309 on transistor 301.

During an ESD event from I/O pad 303 to ground rail 307, the main path (e.g., path 327) for ESD current is through parasitic diode 329 (e.g., as a result of PMOS transistor 331), power rail 333, and ESD clamp 317. As such, during the ESD event, the output terminal of inverter 319 provides a turn-on signal to the gates of transistor 315 and 321 (e.g., the potential at the input terminal of inverter 319 is low while the potential at the output terminal is high). By way of example, ESD current from the ESD event may cause the node between resistor 323 and capacitor 325 (e.g., the node at the input terminal of inverter 319) to be low, for instance, as a result of a well-designed RC time constant of 1-2 microseconds and a fast transient ESD time "ns," causing the output terminal of inverter 319 to be high. Therefore, during the ESD event, gate node 311 is coupled to the ground rail (e.g., VSS), causing transistor 301 to be in an "off" state as the ESD current travels from I/O pad 303 to ground rail 307 through main path 327 or through ESD device 305 (e.g., the ESD device 305 may have a low-voltage trigger). In this way, the circuit in FIG. 3 provides an ESD robust driver circuit with very minimal impact on the I/O area (e.g., only one extra transistor for controlling the driver gate), allowing for other additional components (e.g., additional resistor/capacitor elements). Moreover, issues related to "false trigger" during normal operation are mitigated, or eliminated, as a result of the simple gate driver control circuit 309.

Figure 4:
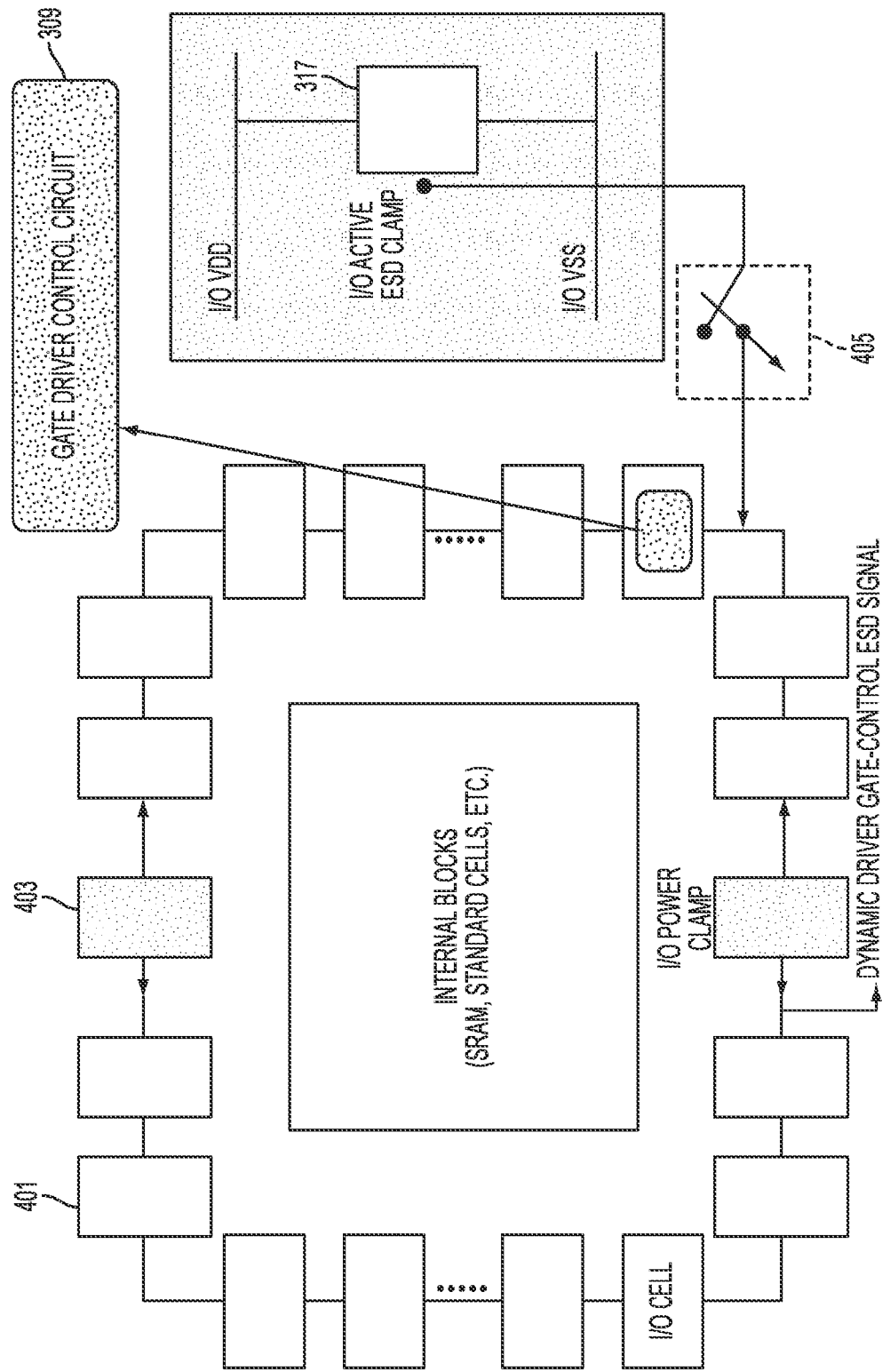
FIG. 4 schematically illustrates a ring I/O circuit, in accordance with an exemplary embodiment of the present disclosure.

FIG. 4 schematically illustrates a ring I/O circuit, in accordance with an exemplary embodiment of the present disclosure. As shown, the ring I/O circuit includes a plurality of I/O cells 401 and a plurality of clamps 403. Each I/O cell may, for instance, include transistors 301 and 331, I/O pad 303, and gate driver control circuit 309. In addition, each clamp 403 may include ESD clamp 317 (e.g., an I/O active ESD clamp). As depicted, ESD clamp 317 may control switch 405 (e.g., the dynamic driver gate-control ESD signal) to turn on transistor 315 in each gate driver control circuit 309 during the ESD event, and to turn off transistor 315 in each gate driver control circuit 309 during normal operation.

The embodiments of the present disclosure can achieve several technical effects, including ESD robustness for I/O driver circuits, more efficient use of I/O area, and elimination of "false triggers" during normal operation. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any other devices utilizing logic or high-voltage technology nodes. The present disclosure therefore enjoys industrial applicability in any of various types of highly integrated semiconductor devices, including devices that use ESD protection devices to pass ESD/Latch-up standards specifications (e.g., liquid crystal display (LCD) drivers, synchronous random access memories (SRAM), One Time Programming (OTP), and power management products).

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
    a first NMOS transistor having a first source, a first drain, and a first gate, wherein the first source is coupled to a ground rail, and the first drain is coupled to an I/O pad;
    a gate driver control circuit including a second NMOS transistor having a second source, a second drain, and a second gate, wherein the second drain is coupled to the first gate, the second source is coupled to the ground rail, and the gate driver control circuit provides a ground potential to the first gate during an ESD event occurring from the I/O pad to the ground rail; and
    an ESD clamp including a third NMOS transistor having a third source, a third drain, and a third gate, wherein the second and third gates are coupled.

2. The circuit according to claim 1, wherein the ESD clamp controls a switch to turn on the second NMOS transistor during the ESD event, and turns off the second NMOS transistor during normal operation.

3. The circuit according to claim 1, wherein the ESD clamp provides a turn-on signal to the second gate during the ESD event.

4. The circuit according to claim 2, wherein the ESD clamp further includes:
    an inverter having an output terminal coupled to the second and third gates, wherein the output terminal provides a turn-on signal to the second and third gates during the ESD event.

5. The circuit according to claim 4, wherein the output terminal provides a turn-off signal to the second and third gates during normal operation.

6. The circuit according to claim 4, wherein ESD current flows from the I/O pad to the ground rail through the third NMOS transistor during the ESD event.

7. The circuit according to claim 4, further comprising:
    a PMOS transistor having a fourth source, a fourth drain, and a fourth gate, wherein the fourth drain is coupled to the first drain, and the fourth source is coupled to the third drain.

8. The circuit according to claim 7, further comprising:
    an ESD device coupled to the I/O pad and the first drain, wherein ESD current flows from the I/O pad to the ground rail through the ESD device during the ESD event.

9. The circuit according to claim 8, wherein the ESD device includes a fourth NMOS transistor having a fifth source, a fifth drain, and a fifth gate, and wherein the fifth source and the fifth gate is coupled to the ground rail, and the fifth drain is coupled to the I/O pad.

10. A method comprising:
    providing a first NMOS transistor having a first source, a first drain, and a first gate;
    coupling the first source to a ground rail, and the first drain to an I/O pad;
    providing a gate driver control circuit including a second NMOS transistor having a second source, a second drain, and a second gate;
    coupling the second drain to the first gate, the second source to the ground rail, wherein the gate driver control circuit provides a ground potential to the first gate during an ESD event occurring from the I/O pad to the ground rail; and
    providing an ESD clam including a third NMOS transistor having a third source a third drain, and a third gate, wherein the second and third gates are coupled.

11. The method according to claim 10, wherein the ESD clamp controls a switch to turn on the second NMOS transistor during the ESD event, and turns off the second NMOS transistor during normal operation.

12. The method according to claim 10, wherein the ESD clamp provides a turn-on signal to the second gate during the ESD event.

13. The method according claim 11, further comprising:
providing the ESD clamp with an inverter having an output terminal; and
coupling the output terminal to the second and third gates, wherein the output terminal provides a turn-on signal to the second and third gates during the ESD event.

14. The method according to claim 13, wherein the output terminal provides a turn-off signal to the second and third gates during normal operation.

15. The method according to claim 13, wherein ESD current flows from the I/O pad to the ground rail through the third NMOS transistor during the ESD event.

16. The method according to claim 13, further comprising:
providing a PMOS transistor having a fourth source, a fourth drain, and a fourth gate; and
coupling the fourth drain to the first drain, and the fourth source to the third drain.

17. The method according to claim 16, further comprising:
providing an ESD device; and
coupling the ESD device to the I/O pad and the first drain, wherein ESD current flows from the I/O pad to the ground rail through the ESD device during the ESD event.

18. The method according to claim 17, further comprising:
providing the ESD device with a fourth NMOS transistor having a fifth source, a fifth drain, and a fifth gate; and
coupling the fifth source and the fifth gate to the ground rail, and the fifth drain to the I/O pad.

19. A ring I/O circuit having a plurality of I/O cells, each of the I/O cells comprising:
an I/O pad;
a first NMOS transistor having a first source, a first drain, and a first gate, wherein the first source is coupled to a ground rail, and the first drain is coupled to the I/O pad;
a gate driver control circuit including a second NMOS transistor having a second source, a second drain, and a second gate, wherein the second drain is coupled to the first gate, the second source is coupled to the ground rail, and the gate driver control circuit provides a ground potential to the first gate during an ESD event occurring from the I/O pad to the ground rail; and
an ESD clamp including a third NMOS transistor having a third source, a third drain, and a third gate, wherein the second and third gates are coupled.

20. The ring I/O circuit according to claim 19, wherein the ESD clamp further comprises:
an inverter having an output terminal coupled to at least some of the second and third gates, wherein the output terminal provides a turn-on signal to the coupled second and third gates during the ESD event, and a turn-off signal to the coupled second and third gates during normal operation.

* * * * *